United States Patent

Eberle et al.

[11] Patent Number: 6,027,535
[45] Date of Patent: *Feb. 22, 2000

[54] BATTERY CHARGER FOR POWER TOOLS

[75] Inventors: Robert Eberle, Nürtingen; Ulrich Haller, Stuttgart, both of Germany

[73] Assignee: Metabowerke GmbH & Co., Nurtingen, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/806,726

[22] Filed: Feb. 27, 1997

[30] Foreign Application Priority Data

Feb. 27, 1996 [DE] Germany .................... 196 07 226

[51] Int. Cl.⁷ ...................................... H05K 7/20
[52] U.S. Cl. .................. 631/690; 361/756; 361/802
[58] Field of Search ...................... 320/110, 125; 361/600, 679, 688, 690, 692–697, 724, 741, 752, 756, 758, 802

[56] References Cited

U.S. PATENT DOCUMENTS

| | | | |
|---|---|---|---|
| 4,945,448 | 7/1990 | Bremenour et al. | 361/383 |
| 5,111,362 | 5/1992 | Flamm et al. | 361/752 |
| 5,162,719 | 11/1992 | Tomura et al. | 320/110 |
| 5,233,281 | 8/1993 | Chiang et al. | 320/2 |
| 5,245,266 | 9/1993 | Yuen | 320/110 |
| 5,256,955 | 10/1993 | Tomura et al. | 320/2 |
| 5,262,710 | 11/1993 | Taylor | 320/110 |
| 5,515,240 | 5/1996 | Rodeffer et al. | 361/752 |

FOREIGN PATENT DOCUMENTS

| | | |
|---|---|---|
| 864248 | 4/1941 | France . |
| 30 09 141 A1 | 10/1981 | Germany . |
| 31 21 906 A1 | 4/1982 | Germany . |
| 36 09 083 A1 | 9/1987 | Germany . |
| 92 03 363 U | 6/1992 | Germany . |
| 92 14 972 U | 2/1993 | Germany . |
| 41 21 545 C2 | 6/1993 | Germany . |

OTHER PUBLICATIONS

IBM Technical Disclosure Bulletin, "Heat Sink Assembly for TAB–Mounted Devices", vol. 31, No. 6, Nov. 1988, pp. 372–373, 361/690.

*Primary Examiner*—Gregory Thompson
*Attorney, Agent, or Firm*—Jones, Tullar & Cooper, P.C.

[57] ABSTRACT

A charger for a rechargeable battery pack of a power tool includes a housing and a printed circuit board on which electrical components are mounted. The printed circuit board being mounted in the housing. The housing includes vent openings disposed below the printed circuit board and vent openings disposed above the printed circuit board.

36 Claims, 2 Drawing Sheets

BATTERY CHARGER FOR POWER TOOLS

BACKGROUND OF THE INVENTION

The present invention relates to a charger for a rechargeable battery pack of a power tool, having a housing with vent openings and a printed circuit board inside the housing which carries electrical components, the printed circuit board being disposed substantially parallel to a closed housing bottom.

Such chargers are known, and the problem of adequate cooling of the electrical components inside the housing arises again and again. If cooling is inadequate, in the case of a malfunction overheating can occur to such an extent that the soldered connections of the components on the printed circuit board become soft and even melt, which make the unit nonfunctional. With the RC-universal charger made by ATLAS/COPCO, it has already been proposed that ventilation slits be provided extending substantially over the entire height of two side walls of the housing. However, it has been found that this provision cannot assure satisfactory cooling.

OBJECT AND SUMMARY OF THE INVENTION

An object of the present invention is to improve a charger of the type referred to at the outset so that more-effective cooling of the electrical components on the printed circuit board can be attained in the interior of the housing.

This object is attained in accordance with the present invention in that the vent openings are disposed, spaced apart from one another, above and below the printed circuit board.

In this way, more-effective cooling can be furnished in a charger according to the present invention, since on the one hand the air throughput in the housing interior can be increased, and on the other a more-effective oncoming flow to the printed circuit board and the electrical components can be attained. The air in the interior of the housing heats up, rises, and like a draft pulls more air in after it, through the lower vent openings that act as air inlet openings, while the heated air passes through the upper vent openings that act as air outlet openings, and leaves the housing through them.

The inflowing air entering the housing below the printed circuit board already furnishes substantial cooling capacity on the underside of the printed circuit board; because of the metal conductor tracks, which have good thermal conductivity, this already contributes, below the printed circuit board, to effective cooling of the components.

In an advantageous embodiment of the present invention, the vent openings provided below the printed circuit board are embodied in at least one side wall of the housing. This embodiment offers the further advantage that it meets the United States safety specification UL 1012 for chargers without mains safety disconnection, which specifies that all components carrying mains voltage not be touchable from the housing bottom, and that the housing bottom must be closed. Hence the present invention has an especially advantageous effect for such tools.

The vent openings may intrinsically have an arbitrary cross section; preferably, they are slitlike and extend obliquely, perpendicular or parallel to the housing bottom.

In a preferred charger, the vent openings provided below the printed circuit board are bounded at the bottom by the housing bottom and at the top by an inward-protruding step or by a shoulder on the inside of the housing wall. A flow path extending parallel to the housing bottom is defined by the housing bottom on the one hand and by the step or shoulder on the other. As a result, the inflowing air is carried to the middle of the housing or the center of the printed circuit board.

The step or the shoulder can simultaneously serve as a bearing surface for the printed circuit board.

In a very particularly advantageous embodiment of the charger of the present invention, the at least one updraft opening is embodied between the printed circuit board and the inside of at least one side wall of the housing. The air flowing into the space below the printed circuit board can then rise through the one or preferably more updraft openings on the side wall of the housing and can cool the electrical components provided on the top side of the printed circuit board and finally leave the housing through the upper air outlet openings. The aforementioned updraft opening between the printed circuit board and the side wall of the housing is preferably slitlike or elongated.

The updraft openings may also be bounded by a recess, open on its periphery, in the printed circuit board.

In a further variant of the present invention, ribs are formed on the inside of at least one side wall of the housing; these ribs keep the printed circuit board spaced apart from the side wall of the housing and thus form the updraft opening.

In a further preferred embodiment of the present invention, at least one and preferably more updraft openings are provided in the printed circuit board itself. To further increase the cooling capacity of the air flow, it proves to be advantageous if a cooling baffle or cooling fins are provided on the printed circuit board. These features are then preferably arranged such that they are cooled by the rising air, or in other words, are in particular located above an updraft opening.

Other characteristics, details and advantages of the present invention will become apparent from the appended claims and the drawing and ensuing description of two preferred embodiments of the charger of the present invention.

DESCRIPTION OF THE PREFERRED EMBODIMENTS

Figure 1:
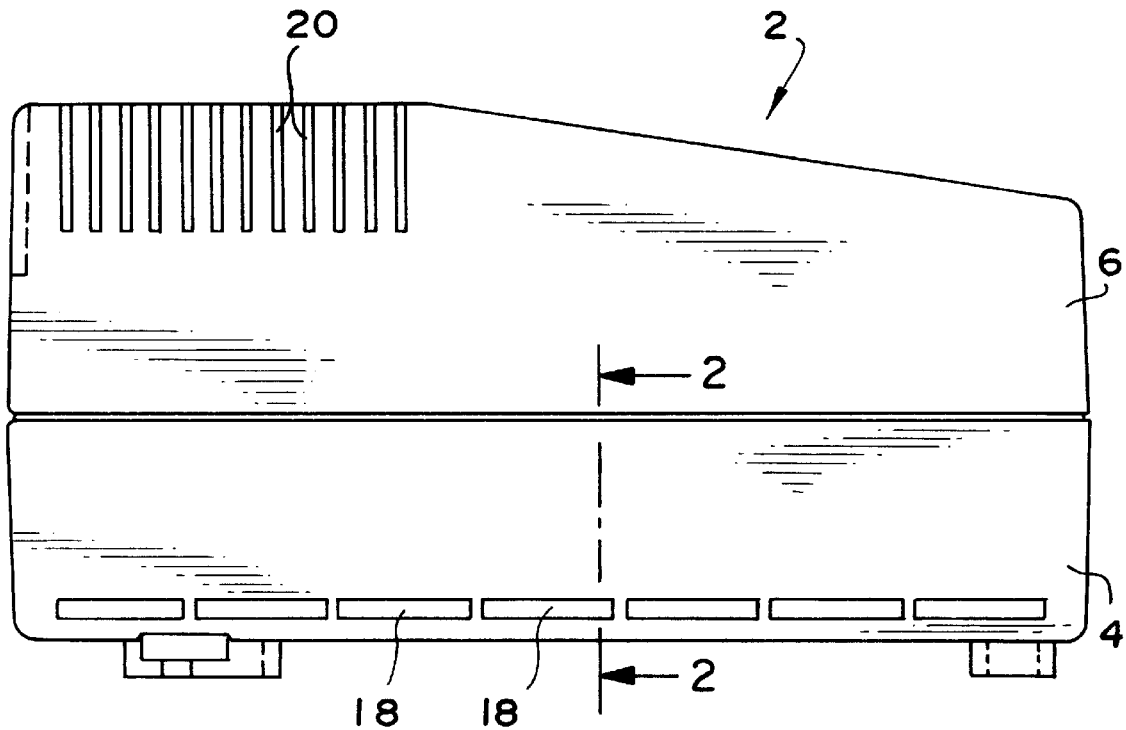
FIG. 1 shows a side view of a first embodiment of the charger of the present invention.

A capacitor charger shown in FIG. 1 includes a housing 2, which is formed by a lower housing half-shell 4 and an upper housing half-shell 6. In the interior of the housing 2, a printed circuit board 8 is disposed essentially extending parallel to a housing bottom 10 of the housing 2. The printed circuit board 8 carries the electrical components, indicated by reference numeral 12, of the capacitor charger.

In the opposed side walls 14 and 16 of the lower housing part 4, elongated vent openings 18 are arranged extending parallel to the housing bottom 10. These vent openings open into the interior of the housing 2 below the plane of the printed circuit board 8. In the upper housing part 6, vent openings 20 are likewise provided, which act as air outlet openings. The lower vent openings 18, acting as air inlet openings, are bounded at the bottom by the housing bottom 10 and at the top by an inward-protruding step 22 of the housing side walls 14 and 16. This step 22 extending along the entire length of the housing side walls 14, 16, together with the opposed region of the housing bottom 10, forms a flow path, indicated by reference numeral 24, that extends parallel to the housing bottom 10.

Figure 2:
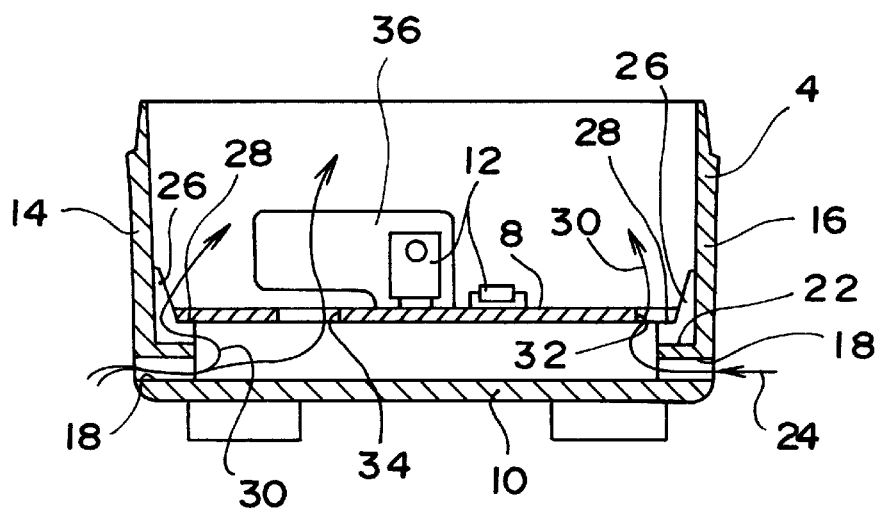
FIG. 2 shows a section through the lower housing part of the charger of FIG. 1 taken along the line 2—2.

Above the step 22, ribs 26 extending perpendicular to the housing bottom 10 are formed inside the housing 2. The ribs 26 have a bearing portion 28, extending parallel to the housing bottom 10, on which the printed circuit board 8 is supported. The printed circuit board 8 is thus disposed spaced apart from the step 22, so that a plurality of updraft openings or updraft paths, as represented by the arrows 30, are formed between the printed circuit board 8, the step 22, and the various housing side walls 14, 16. Through these updraft openings or updraft paths 30, the air flowing into the space below the printed circuit board 8 through the vent openings 18 can rise to above the printed circuit board 8. As shown on the right in FIG. 2, peripherally open recesses 32 are provided in the printed circuit board 8, which further enlarge the updraft openings 30. Moreover, in the interior of the printed circuit board 8, a further updraft opening 34 is provided; above it is a cooling baffle 36, arranged so that it is cooled by the air rising through the opening 34.

Figure 3:
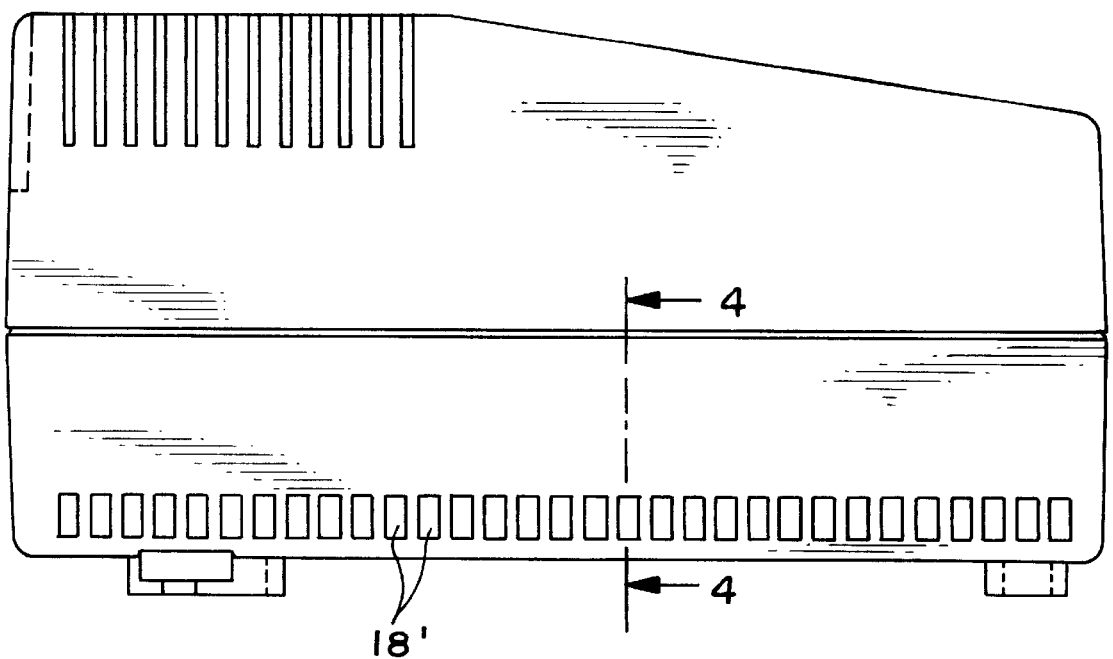
FIG. 3 shows a side view of a second embodiment of the charger of the present invention.
Figure 4:
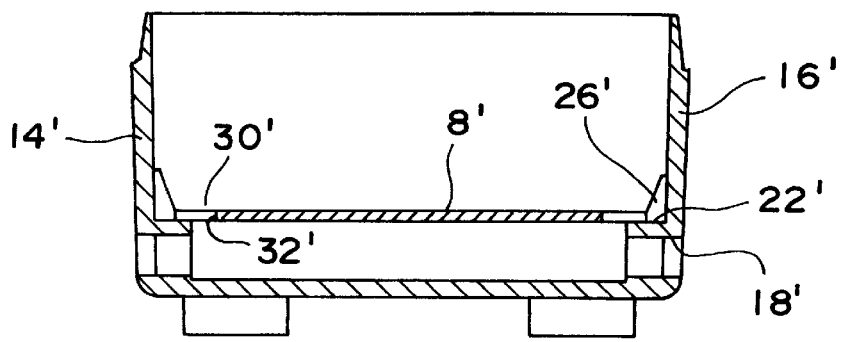
FIG. 4 shows a section through the lower housing part of the charger of FIG. 3 taken along the line 4—4.

The embodiment of FIG. 3 differs from the embodiment described above in that the lower vent openings 18', while also being elongated, are disposed with their longitudinal side extending crosswise to the housing bottom 10. The ribs 26' also provided in this embodiment, however, have no bearing portion; instead, the printed circuit board 8' rests directly on the inward-protruding step 22' of the housing side walls 14', 16'. To form updraft openings 30', the printed circuit board 8' has peripherally open recesses 32'.

What is claimed is:

1. A charger for a rechargeable battery pack of a power tool, comprising:
    a housing;
    electrical components; and
    a printed circuit board to which said electrical components are mounted, said printed circuit board being disposed inside said housing,
    wherein said housing has side walls and a bottom and includes means for mounting said printed circuit board, vent openings disposed in at least one of said side walls below said printed circuit board, vent openings disposed above said printed circuit board, and at least one updraft opening provided in said printed circuit board in conjunction with said means for mounting.

2. The charger as defined in claim 1, wherein the vent openings below said printed circuit board are slitlike and extend perpendicular to the housing bottom.

3. The charger as defined in claim 1, wherein the vent openings below said printed circuit board are slitlike and extend parallel to the housing bottom.

4. The charger as defined in claim 1, wherein the vent openings below said printed circuit board are located adjacent the housing bottom.

5. The charger as defined in claim 3, wherein the vent openings below said printed circuit board are located adjacent the housing bottom.

6. The charger as defined in claim 3, wherein the vent openings below said printed circuit board are located adjacent the housing bottom.

7. The charger as defined in claim 1, wherein said means for mounting comprises an inwardly protruding step associated with said vent openings below said printed circuit board, said inwardly protruding step bounding the top of said vent openings.

8. The charger as defined in claim 7, wherein said step defines a flow path extending parallel to the housing bottom.

9. The charger as defined in claim 7, wherein said steps forms a bearing surface for said printed circuit board.

10. The charger as defined in claim 2, wherein said means for mounting comprises an inwardly protruding step associated with said vent openings below said printed circuit board, said inwardly protruding step bounding the top of said vent openings.

11. The charger as defined in claim 10, wherein said step defines a flow path extending parallel to the housing bottom.

12. The charger as defined in claim 10, wherein said step forms a bearing surface for said printed circuit board.

13. The charger as defined in claim 3, wherein said means for mounting comprises an inwardly protruding step associated with said vent openings below said printed circuit board, said inwardly protruding step bounding the top of said vent openings.

14. The charger as defined in claim 13, wherein said step defines a flow path extending parallel to the housing bottom.

15. The charger as defined in claim 13, wherein said step forms a bearing surface for said printed circuit board.

16. The charger as defined in claim 4, wherein said means for mounting comprises an inwardly protruding step associated with said vent openings below said printed circuit board, said inwardly protruding step bounding the top of said vent openings.

17. The charger as defined in claim 16, wherein said step defines a flow path extending parallel to the housing bottom.

18. The charger as defined in claim 16, wherein said step forms a bearing surface for said printed circuit board.

19. The charger as defined in claim 1, wherein said means for mounting comprises a shoulder associated with said vent openings below said printed circuit board, said shoulder bounding the top of said vent openings.

20. The charger as defined in claim 19, wherein said shoulder defines a flow path extending parallel to the housing bottom.

21. The charger as defined in claim 19, wherein said shoulder forms a bearing surface for said printed circuit board.

22. The charger as defined in claim 3, wherein said means for mounting comprises a shoulder associated with said vent openings below said printed circuit board, said shoulder bounding the top of said vent openings.

23. The charger as defined in claim 22, wherein said shoulder defines a flow path extending parallel to the housing bottom.

24. The charger as defined in claim 22, wherein said shoulder forms a bearing surface for said printed circuit board.

25. The charger as defined in claim 4, wherein said means for mounting comprises a shoulder associated with said vent openings below said printed circuit board, said shoulder bounding the top said vent openings.

26. The charger as defined in claim 25, wherein said shoulder defines a flow path extending parallel to the housing bottom.

27. The charger as defined in claim 25, wherein said shoulder forms a bearing surface for said printed circuit board.

28. The charger as defined in claim 5, wherein said means for mounting comprises a shoulder associated with said vent openings below said printed circuit board, said shoulder bounding the top of said vent opening.

29. The charger as defined in claim 28, wherein said shoulder defines a flow path extending parallel to the housing bottom.

30. The charger as defined in claim 28, wherein said shoulder forms a bearing surface for said printed circuit board.

31. The charger as defined in claim 1, wherein said means for mounting includes a plurality of ribs formed formed on at least one side wall of said housing, said ribs serving to keep said printed circuit board spaced apart from the side wall and thus from said updraft opening.

32. The charger as defined in claim 31, wherein said ribs are formed on two opposed walls of said housing and are slanted such that on insertion of said printed circuit board, said printed circuit board is centered relative to said housing walls.

33. The charger as defined in claim 1, wherein said printed circuit board is provided with a cooling baffle.

34. The charger as defined in claim 33, wherein said cooling baffle is disposed such that it is cooled by the updraft.

35. A charger for a rechargeable battery pack of a power tool, comprising:

a housing;

electrical components; and a printed circuit board to which said electrical components are mounted, said printed circuit board being disposed inside said housing, wherein said housing has side walls and a bottom and includes vent openings disposed in at least one of said side walls below said printed circuit board, vent openings disposed above said printed circuit board; and at least one updraft opening embodied between said printed circuit board and the inside of at least one of said side walls, and wherein said at least one updraft opening is bounded by a peripheral open recess in said printed circuit board.

36. The charger as defined in claim 35, further comprising:

at least one further updraft opening provided in said printed circuit board.

* * * * *